(12) United States Patent
Gu et al.

(10) Patent No.: US 8,595,429 B2
(45) Date of Patent: Nov. 26, 2013

(54) WIDE INPUT/OUTPUT MEMORY WITH LOW DENSITY, LOW LATENCY AND HIGH DENSITY, HIGH LATENCY BLOCKS

(75) Inventors: Shiqun Gu, San Diego, CA (US); Matthew M. Nowak, San Diego, CA (US); Anand Srinivasan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 289 days.

(21) Appl. No.: 12/862,094

(22) Filed: Aug. 24, 2010

(65) Prior Publication Data
US 2012/0054422 A1 Mar. 1, 2012

(51) Int. Cl.
*G06F 12/00* (2006.01)
(52) U.S. Cl.
USPC ............................................... 711/105
(58) Field of Classification Search
USPC ............................................... 711/105
See application file for complete search history.

(56) References Cited

U.S. PATENT DOCUMENTS

| 5,608,264 | A | 3/1997 | Gaul |
| 6,141,245 | A | 10/2000 | Bertin et al. |
| 6,150,724 | A | 11/2000 | Wenzel et al. |
| 6,376,909 | B1 | 4/2002 | Forbes et al. |
| 7,508,707 | B2 | 3/2009 | Nakai et al. |
| 7,623,365 | B2 | 11/2009 | Jeddeloh |
| 2007/0019481 | A1* | 1/2007 | Park ............................... 365/193 |
| 2007/0091707 | A1 | 4/2007 | Hidaka |
| 2008/0195831 | A1* | 8/2008 | Tsukamoto et al. ........... 711/167 |
| 2008/0283995 | A1 | 11/2008 | Bucki et al. |
| 2009/0113535 | A1* | 4/2009 | Taylor et al. ..................... 726/11 |
| 2009/0194864 | A1 | 8/2009 | Dang et al. |
| 2011/0042825 | A1* | 2/2011 | Ito et al. ........................ 257/774 |
| 2011/0087834 | A1* | 4/2011 | Tremaine ...................... 711/105 |

OTHER PUBLICATIONS

International Search Report and Written Opinion—PCT/US2011/048885—ISA/EPO—Mar. 2, 2012.

* cited by examiner

*Primary Examiner* — Hoai V Ho
*Assistant Examiner* — Min Huang
(74) *Attorney, Agent, or Firm* — Michelle S. Gallardo

(57) ABSTRACT

External memory having a high density, high latency memory block; and a low density, low latency memory block. The two memory blocks may be separately accessed by one or more processing functional units. The access may be a direct memory access, or by way of a bus or fabric switch. Through-die vias may connect the external memory to a die comprising the one or more processing functional units.

30 Claims, 6 Drawing Sheets

WIDE INPUT/OUTPUT MEMORY WITH LOW DENSITY, LOW LATENCY AND HIGH DENSITY, HIGH LATENCY BLOCKS

FIELD

The present invention relates to electronic memory, and more particularly, to Random Access Memory.

BACKGROUND

In many applications, DRAM (Dynamic Random Access Memory) stores data and instructions used by one or more processing units. Whereas the processing units are often integrated on a single silicon die (chip), some of the DRAM, or the entire DRAM, may be integrated on the same die as the processing units, or some of the DRAM may be integrated on a separate die that is electrically coupled to the die containing the processing units.

DRAM that is integrated on a die separate from the die containing the processing units that access the DRAM may be termed external memory. External memory may be designed to be relatively low in cost but with high density, where density may refer to the number of bytes per area of silicon die, or the total number of bytes that may be stored and accessed. However, the tradeoff is that conventional electrical coupling between the external memory on one die and the processing units on another die may not have sufficient bandwidth to support high speed communication between the external memory and the processing units.

In some applications, DRAM may be embedded on the same die as the processing units that access the DRAM, abbreviated as eDRAM (embedded DRAM). Embedding allows for wider busses and access speed, so that eDRAM is a relatively low latency memory. Fabricating processing units, often as CMOS (Complementary Metal Oxide Semiconductor) logic, is relatively costly compared to the simpler process of fabricating DRAM because more processing steps are involved. Accordingly, adding processing steps to fabricate eDRAM embedded with logic (processing units) adds to the overall fabrication cost.

Furthermore, embedding eDRAM on a die with other processing units consumes valuable die area. Because the cost per unit die increases substantially as die area increases, fabricating a die comprising both eDRAM and CMOS logic may not be economically viable for some applications.

SUMMARY

In an embodiment, a packaged integrated circuit includes a first die with a random access memory, where the random access memory includes a first memory block having a first latency, and a second memory block having a second latency less than the first latency. The packaged integrated circuit also includes a second die having an active side, and through-die vias to electrically couple the active side to the random access memory.

In another embodiment, a packaged integrated circuit includes a first die with a random access memory, the random access memory having a first memory block with a first latency, a second memory block with a second latency less than the first latency, a first set of package contacts electrically coupled to the first memory block, and a second set of package contacts electrically coupled to the second memory block. The packaged integrated circuit also includes a second die comprising an active side, a third set of package contacts electrically coupled to the active side and to the first set of package contacts, and a fourth set of package contacts electrically coupled to the active side and to the second set of package contacts.

In another embodiment, a system includes a first die with a first memory block having a first density and a first latency; and a second memory block having a second density larger than the first density, and a second latency larger than the first latency. The system also includes a second die with a first functional unit to access data stored in the first die, and a first cache in communication with the first functional unit, wherein the first cache has direct memory access to the first memory block.

In another embodiment, a system includes a packaged integrated circuit comprising a first die with a random access memory, the random access memory having a first memory block with a first latency, and a second memory block with a second latency less than the first latency. The packaged integrated circuit also comprises a second die having an active side, and through-die vias to electrically couple the active side to the random access memory. The system also includes a device, such as a set top box, a music player, a video player, an entertainment unit, a navigation device, a communications device, a personal digital assistant (PDA), a fixed location data unit, or a computer, the packaged integrated circuit is integrated into the device.

In another embodiment, a packaged integrated circuit includes a first die having a random access memory, the random access memory having a first memory block with a first latency, and a second memory block with a second latency less than the first latency. The packaged integrated circuit also includes a second die having an active side, and means for electrically coupling the active side to the random access memory.

In another embodiment, a method of sending signals from a second die to a random access memory formed on a first die by way of through-die vias formed in the second die. The random access memory having a first memory block with a first latency, and a second memory block with a second latency less than the first latency. The through-die vias electrically couple an active side on the second die to the random access memory.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
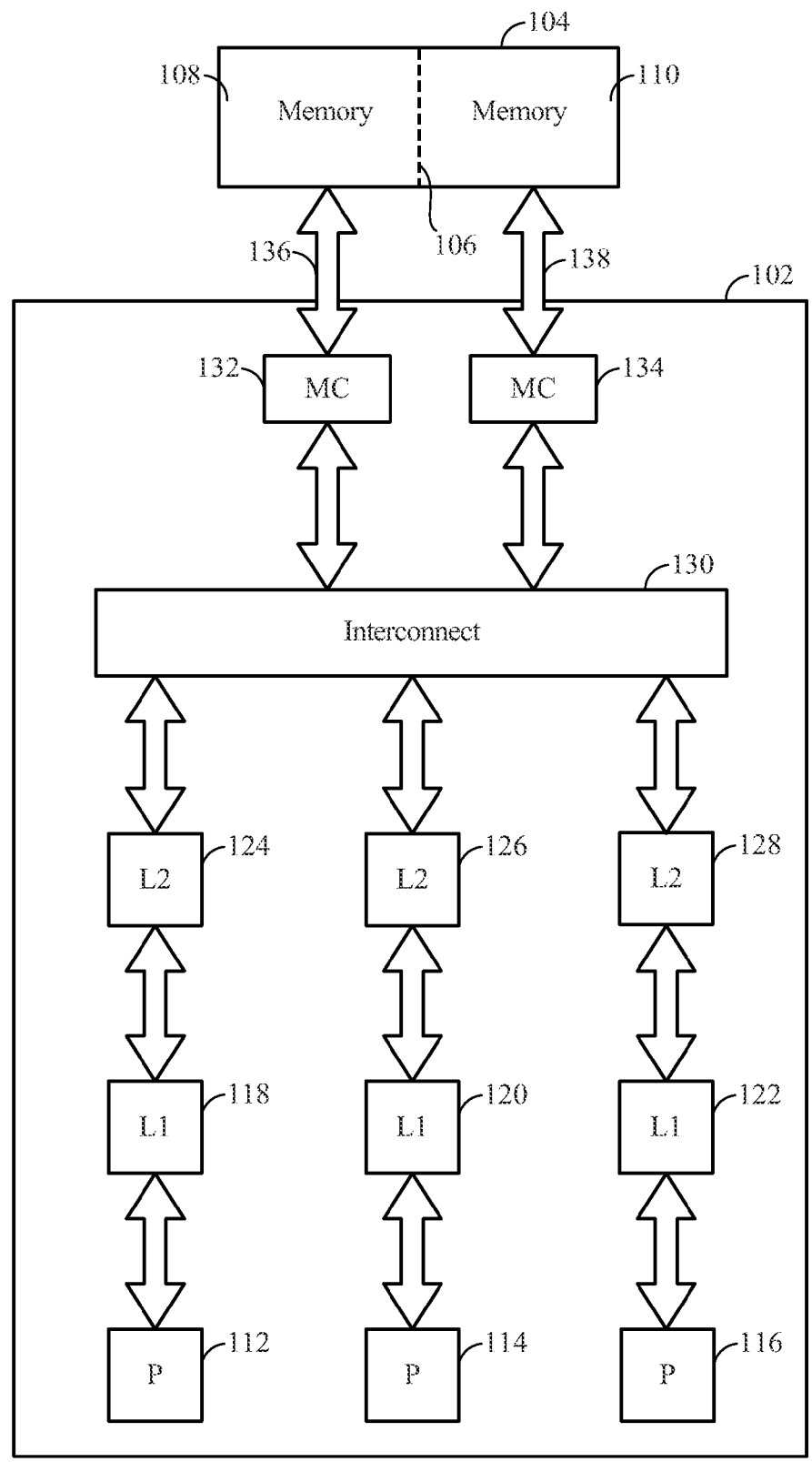
FIG. 1 illustrates system architecture to access external memory.

FIG. 1 is a high-level architectural diagram of an embodiment, where components within the box labeled 102 may be integrated onto the active side of a single die. The box labeled 104 comprises memory, which may be referred to as external memory, and as such will be referred to simply as the external memory 104. The external memory 104 may be integrated onto the active side of a single die, distinct from the die upon which the components within box 102 are integrated. The dice for the external memory 104 and the box 102 components may be stacked on top of each other, and packaged together so as to comprise a multi-chip package. The external memory 104 is not limited to any particular memory technology, and may comprise DRAM or MRAM (Magnetoresistive Random Access Memory), for example.

The external memory 104 comprises two memory blocks, pictorially distinguished by using the dashed line 106. The memory block denoted by the label 108 is a relatively high density, high latency memory; and the memory block denoted by the label 110 is a relatively low density, low latency memory.

The high density memory may comprise a hierarchy of multiple levels of memory for area efficiency, at the expense of long word lines needing a relatively large number of cycles to access or write data. The low latency memory may comprise relatively short word lines at the expense of area efficiency, where the word lines may allow full charge-sense and a pre-charge for each access to help provide low latency. A high density, high latency memory may have a latency several or more times that of a low density, low latency memory. For example, a low density, low latency memory may have a latency of zero or one bus cycle. For some applications, a high density, high latency memory may have a memory density (size or capacity) in the range of 256 Mb (Mega-bits) to 8 Gb (Giga-bits), whereas a low density, low latency memory may have a memory density in the range of 1 Mbit to 256 Mbit. These values for the memory densities merely serve as examples, and as technology advances, memory density tends to increase.

The functional units 112, 114, and 116 are processing functional units. A processing functional unit may be, for example, a microprocessor core, a modem core, or a codec core; and may, for example, be implemented as an application-specific integrated circuit, or as a programmable gate array. In the particular embodiment of FIG. 1, each processing functional unit has access to a level 1 cache, denoted by the labels 118, 120, and 122. There may be additional cache levels, such as for example the second level caches as indicated by the labels 124, 126, and 128. For ease of illustration, only three processing functional units with their corresponding caches are illustrated in the embodiment of FIG. 1. Other embodiments may have a different number of processing functional units and caches.

The caches 124, 126, and 128 are electrically coupled to an interconnect functional unit 130 so that the external memory may be accessed. The interconnect functional unit 130 may be, for example, a bus, or a fabric switch. The memory controllers 132 and 134 allow the interconnect functional unit 130 to read from and write data to the external memory 104. In the illustration of FIG. 1, the arrows 136 and 138 represent electrical coupling of the external memory to the interconnect functional unit 130, where this electrical coupling may comprise more than one kind of physical interconnect, and may be realized by through-die vias, as illustrated in the embodiment of FIG. 2.

Figure 2:
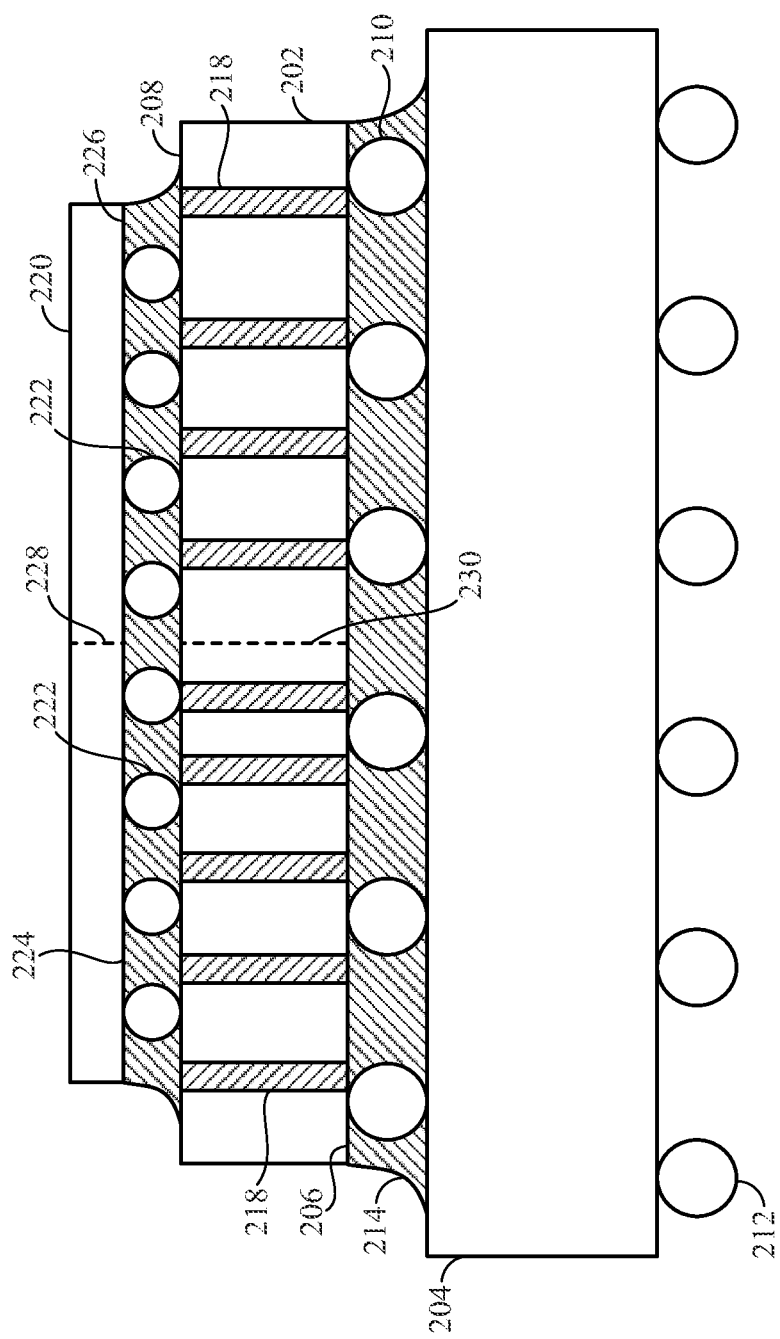
FIG. 2 is a plan view of a stacked integrated circuit package with an external memory coupled to a die using through-die vias.

FIG. 2 is a simplified, plan view (not drawn to scale) of a packaged integrated circuit according to one or more embodiments. The integrated circuit package illustrated in FIG. 2 utilizes flip chip assembly technology. A die 202 is attached and electrically coupled to a package substrate 204. The die 202 includes an active side 206 and a backside 208, where active circuit components (e.g., transistors) are fabricated on the active side 206 according to fabrication techniques well-known in the semiconductor industry. The die 202 may be a silicon die, for example, but some embodiments may use semiconductors other than silicon.

Comparing to the architecture illustrated in FIG. 1, the components within the box 102 are integrated on the active side 206. As is well known in flip chip technology, the die 202 is placed face down on the package substrate 204 so that the active side 206 is proximal to the package substrate 204 relative to the backside 208. A set of conductive bumps 210 form part of the so-called level 1 interconnect so that the circuit components fabricated on the active side 206 are electrically coupled to the package contacts 212. The conductive bumps 210 may comprise solder, for example, and may be fabricated by the Controlled Collapse Chip Connection (C4) evaporative bump process, in which case the conductive bumps 210 are commonly referred to as C4 bumps. For ease of illustration, pads and under bump metallization layers used in flip chip technology are not shown in FIG. 2.

The package contacts 212 form part of the so-called level 2 interconnect, and may take the form of pins or solder balls, for example. For ease of illustration, the connections from the conductive bumps 210 to the package contacts 212 are not shown in FIG. 2. The hatched area labeled 214 denotes an underfill applied to the interface between the die 202 and the package substrate 204. Other protective layers (no shown) may be applied to the package of FIG. 2.

The die 202 includes one or more through-die vias, shown hatched and labeled 218 in FIG. 2. Through-die vias are vias that are formed through (or nearly through) the die 202 to provide electrical connection from the active side 206 to the backside 208. For embodiments in which die 202 is cut from a silicon wafer, the term "through-silicon via" is often used. However, embodiments may use wafers formed from material other than silicon. For example, sapphire wafers are used in some radio frequency applications. Accordingly, the term "through-die via" is used in these letters patent because embodiments are not necessarily limited to dice cut from silicon wafers.

The die 220 comprises the external memory, where the circuit components for the external memory are integrated on the active side 224 of the die 220. Flip chip technology is used to electrically couple and attach the die 220 to the backside 208, where a set of conductive bumps 222 provides electrical connection from the active side 224 of the die 220 to the through-die vias 218. For ease of illustration, not shown are the pads and traces on the backside 208 for electrically connecting the through-die vias 218 to the conductive bumps 222. The hatched area labeled 226 denotes an underfill applied to the interface between the die 220 and the backside 208.

The dashed line 228 in FIG. 2 corresponds to the dashed line 106 in FIG. 1, and denotes the separation of the external memory into the high density, high latency memory block 108 and the low density, low latency memory block 110. The dashed line 228 in FIG. 2 is an abstraction to denote the separation of the external memory into its high density and low density blocks. Similarly, the dashed line 230 is an abstraction to denote interconnects corresponding to the arrows 136 and 138 in FIG. 1, where the through-die vias to the left of the dashed line 230 are connected to the high density, high latency memory block, and the through-die vias to the right of the dashed line 230 are connected to the low density, low latency memory block.

Figure 3:
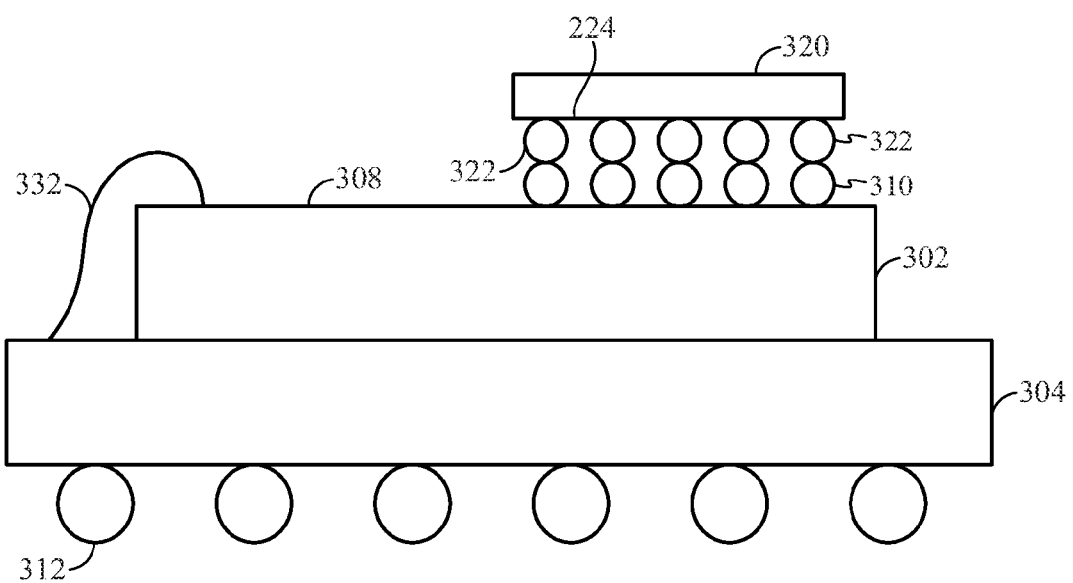
FIG. 3 is a plan view of an external memory coupled to a die using face-to-face package stacking.

For some embodiments, functional units may be electrically coupled to external memory without the use of through-die vias. FIG. 3 is a plan view (not drawn to scale) illustrating one such embodiment, where face-to-face stacking is used. A die 302 has an active side 308 upon which the components within the box 102 are integrated, and a die 320 has an active side 224 upon which the external memory is integrated. A set of conductive bumps 310 on the active side 308, and a set of conductive bumps 322 on the active side 224, allow for electrical communication between the processing functional units integrated on the die 302 and the external memory integrated on the die 320. For ease of illustration, an underfill is not illustrated in FIG. 3. For the particular embodiment illustrated in FIG. 3, the die 302 is attached to a package substrate 304, and wirebonding is used to electrically connect the active side 308 to the package contacts 312. For example, one such wirebond, labeled 332, is illustrated in FIG. 3.

Figure 4:
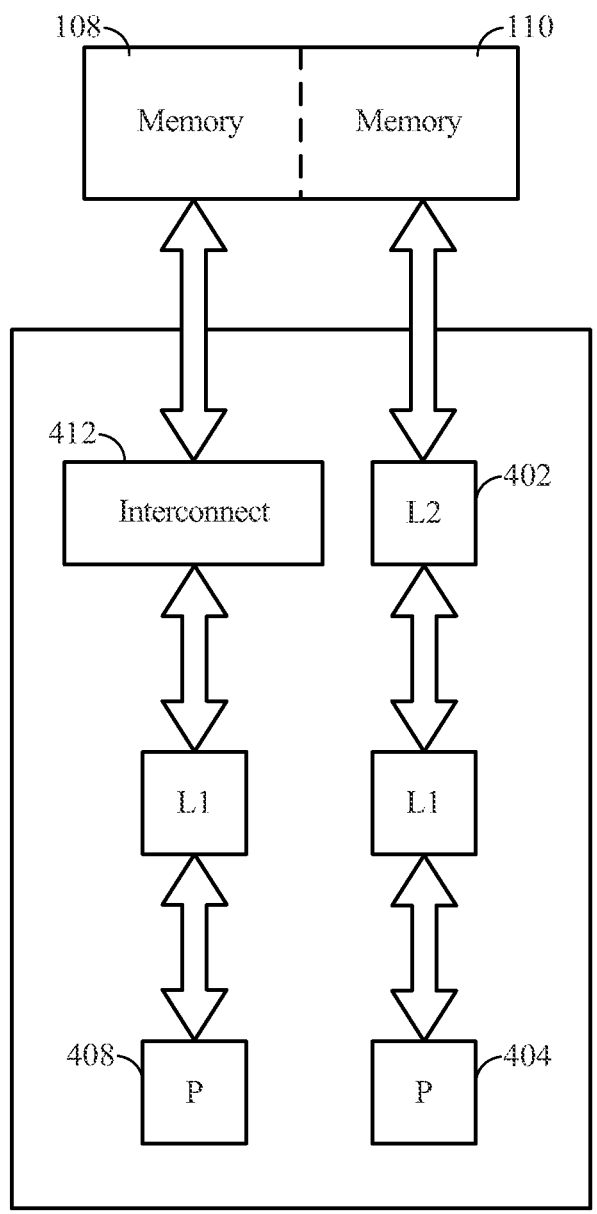
FIG. 4 illustrates system architecture to access external memory.

Embodiments may utilize architectures other than that illustrated in FIG. 1. For example, FIG. 4 illustrates an architecture in which the second level cache 402 for a processing functional unit 404 is directly coupled to the low density, low latency memory block 110; whereas a processing functional unit 408 accesses the high density, highly latency memory block 108 by way of an interconnect functional unit 412, which may be a bus or a fabric switch, for example. In this way, the processing functional unit 404 may make a direct memory access for the data and instructions stored in the low density, low latency memory block 110.

Figure 5:
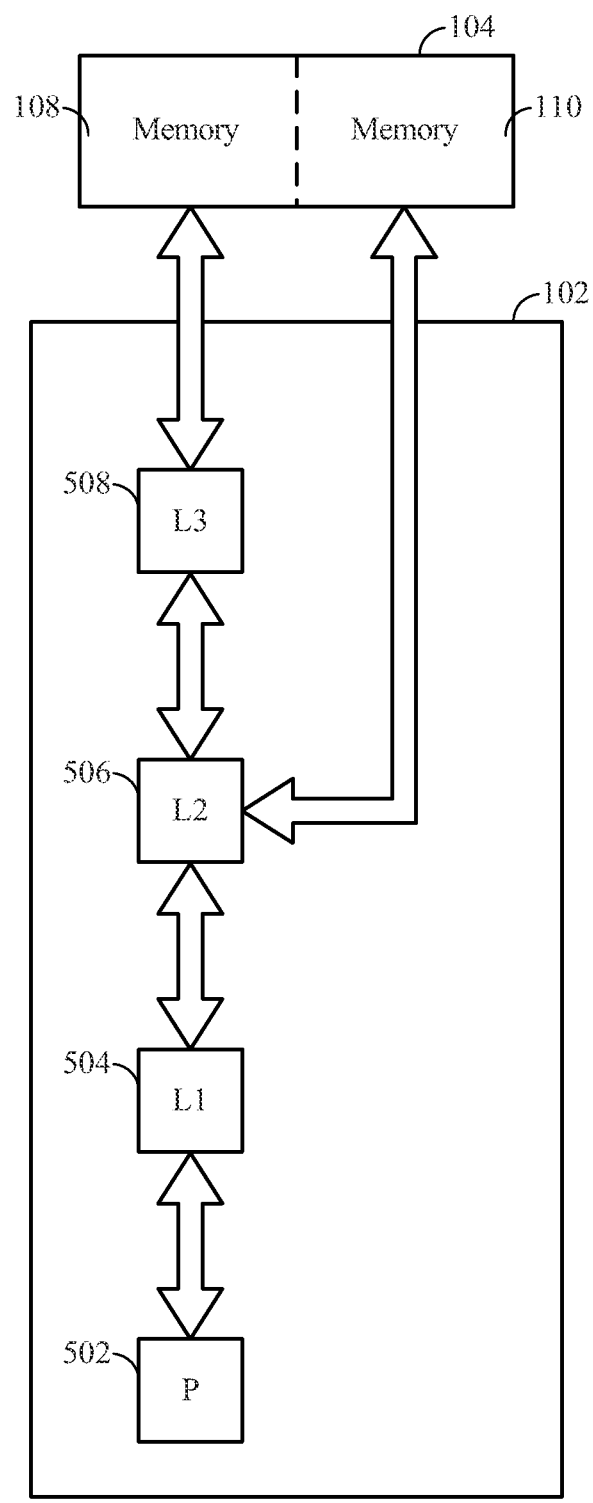
FIG. 5 illustrates system architecture to access external memory.

Some embodiments may include a processing functional unit that may access both memory blocks by way of different levels of cache. FIG. 5 illustrates an architecture for an embodiment with a processing functional unit 502 having a first level cache 504, a second level cache 506, and a third level cache 508. The second level cache 506 may directly access the low density, low latency memory block 110. The third level cache 508 may directly access the high density, high latency memory block 108. For simplicity, the memory controllers are not shown in FIGS. 4 and 5.

For systems comprising processing units and large DRAM, the embodiments described herein are expected to achieve cost savings compared to conventional methods for embedding DRAM with processing units. Because the DRAM is not embedded with the processing units, additional processing steps are not required, and large die sizes may be avoided. By stacking the DRAM chip onto a processing chip, utilizing package contacts or through-die vias for electrical communication, complicated memory interface circuits may be avoided, and relatively large data bandwidths may be realized.

Figure 6:
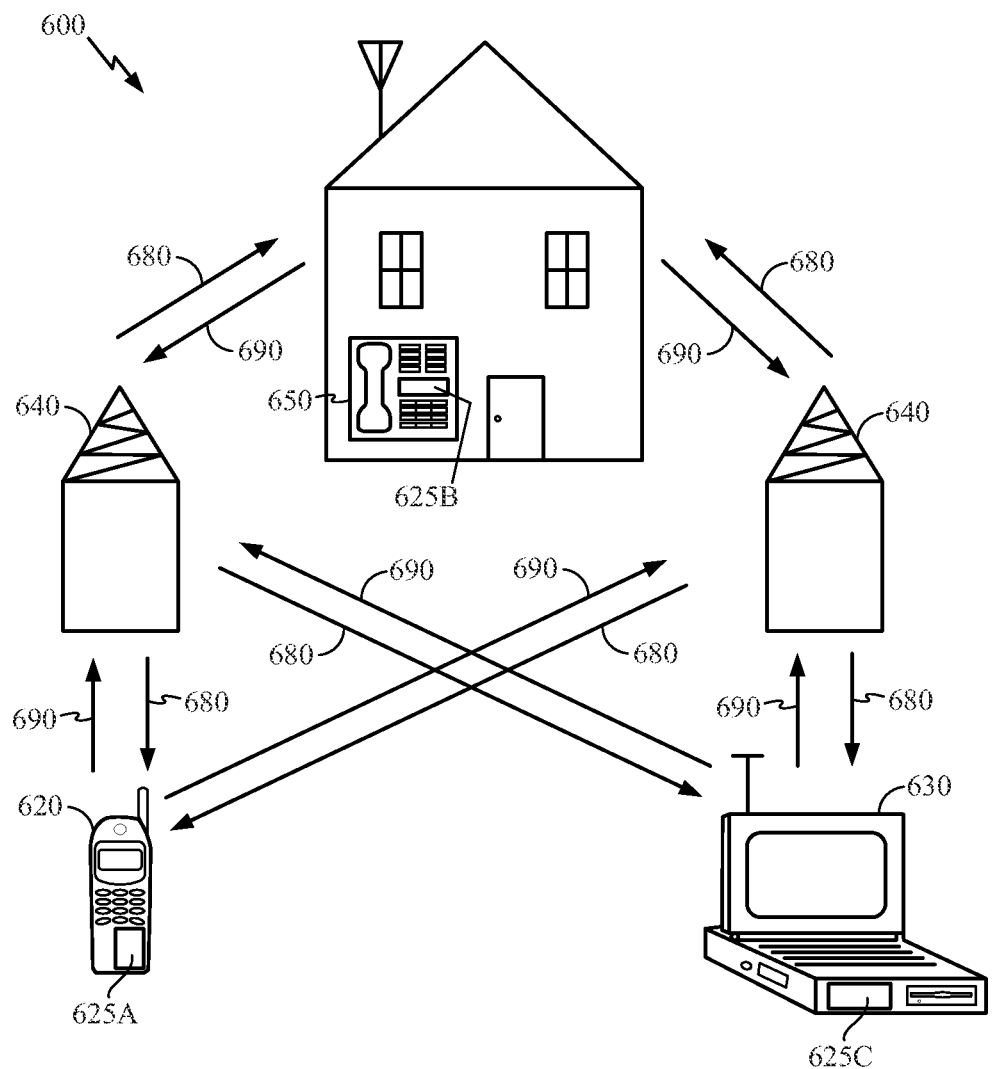
FIG. 6 illustrates one or more communication systems employing an embodiment.

FIG. 6 is a diagram illustrating a wireless communication system. In some embodiments, a system 600 includes multiple remote units 620-624, and multiple base stations 650-652. It can be recognized that typical wireless communication systems may have many more remote units and base stations. The remote units 620-624 include multiple semiconductor devices 630-634 having an integrated circuit package comprising the first and second tier dice as described in these letters patent. FIG. 6 shows a forward link signal 680 from the base stations 650-652 and the remote units 620-624, and a reverse link signal 690 from the remote units 620-624 to the base stations 650-652.

In other embodiments, in FIG. 6 the remote unit 620 is shown as a mobile telephone, the remote unit 622 is shown as a portable computer, and the remote unit 624 is shown as a fixed location remote unit in a wireless local loop system. For example, the remote units may be mobile phones, hand-held personal communication systems (PCS) units, portable data units such as personal data assistants, navigation devices (e.g., GPS enabled devices,) set-top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these illustrated units.

Various modifications may be made to the disclosed embodiments without departing from the scope of the invention as claimed below.

What is claimed is:

1. A packaged integrated circuit comprising:
   a first die comprising a random access memory, the random access memory comprising a first memory block having a first latency, and a second memory block having a second latency less than the first latency, wherein the first and second latencies are based on lengths of word lines within the first and second memory blocks respectively; and
   a second die comprising an active side, the active side comprising a first part and a second part, and a first set of through-die vias to electrically couple the first part of the active side to the first memory block and a second set of through-die vias to electrically couple the second part of the active side to the second memory block.

2. The packaged integrated circuit as set forth in claim 1, the first memory block having a first memory density, and the second memory block having a second memory density less than the first memory density.

3. The packaged integrated circuit as set forth in claim 2, wherein the first memory density is in the range of 128 Mb to 8 Gb.

4. The packaged integrated circuit as set forth in claim 2, wherein the second memory density is in the range of 1 Mb to 256 Mb.

5. The packaged integrated circuit as set forth in claim 1, wherein the first latency is at least two times greater than the second latency.

6. The packaged integrated circuit as set forth in claim 1, wherein the second latency is selected from the group consisting of zero cycles and 1 cycle.

7. The packaged integrated circuit as set forth in claim 1, wherein the random access memory is selected from the group consisting of dynamic random access memory and magnetoresistive random access memory.

8. A packaged integrated circuit comprising:
   a first die comprising a random access memory, the random access memory comprising a first memory block having a first latency, and a second memory block having a second latency less than the first latency, wherein the first and second latencies are based on lengths of word lines within the first and second memory blocks respectively, a first set of package contacts electrically coupled to the first memory block, and a second set of package contacts electrically coupled to the second memory block; and
   a second die comprising an active side, the active side comprising first part and a second part, and a third set of package contacts electrically coupled to the first part of the active side and to the first set of package contacts, and a fourth set of package contacts electrically coupled to the second part of the active die and to the second set of package contacts.

9. The packaged integrated circuit as set forth in claim 8, the first memory block having a first memory density, and the second memory block having a second memory density less than the first memory density.

10. The packaged integrated circuit as set forth in claim 9, wherein the first memory density is in the range of 128 Mb to 8 Gb.

11. The packaged integrated circuit as set forth in claim 9, wherein the second memory density is in the range of 1 Mb to 256 Mb.

12. The packaged integrated circuit as set forth in claim 8, wherein the first latency is at least two times greater than the second latency.

13. The packaged integrated circuit as set forth in claim 8, wherein the second latency is selected from the group consisting of zero cycles and 1 cycle.

14. A system comprising:
a first die comprising a random access memory, the random access memory comprising a first memory block having a first latency, and a second memory block having a second latency less than the first latency, wherein the first and second latencies are based on lengths of word lines within the first and second memory blocks respectively; and
a second die comprising a first functional unit to access data stored in the first die, and a first cache in communication with the first functional unit, wherein the first cache has direct memory access to the first memory block.

15. The system as set forth in claim 14, the second die further comprising a second cache in communication with the first functional unit, wherein the second cache has direct memory access to the second memory block.

16. The system as set forth in claim 15, wherein the second cache is a higher level cache than the first cache.

17. The system as set forth in claim 14, the second die further comprising:
a second functional unit; and
a bus in communication with the first and second functional units, and with the first and second memory blocks.

18. The system as set forth in claim 14, the second die further comprising:
a bus in communication with the first functional unit and the second memory block;
a second functional unit; and
a cache in communication with the second functional unit and having direct memory access to the first memory block.

19. The system as set forth in claim 18, wherein the second functional unit comprises a modem.

20. The system as set forth in claim 14, the first die comprising a first set of bumps; and the second die comprising a second set of bumps in electrical contact with the first set of bumps.

21. The system as set forth in claim 14, the first die comprising a set of bumps; and the second die comprising a set of through-die vias in electrical contact with the set of bumps.

22. The system as set forth in claim 14, further comprising a device selected from the group consisting of a set top box, a music player, a video player, an entertainment unit, a navigation device, a communications device, a personal digital assistant (PDA), a fixed location data unit, and a computer; wherein the first die and the second die are integrated into the device.

23. A system comprising:
a packaged integrated circuit comprising:
a first die comprising a random access memory, the random access memory comprising a first memory block having a first latency, and a second memory block having a second latency less than the first latency, wherein the first and second latencies are based on lengths of word lines within the first and second memory blocks respectively; and
a second die comprising an active side, the active side comprising a first part and a second part, and a first set of through-die vias to electrically couple the first part of the active side to the first memory block and a second set of through-die vias to electrically couple the second part of the active side to the second memory block; and
a device selected from the group consisting of a set top box, a music player, a video player, an entertainment unit, a navigation device, a communications device, a personal digital assistant (PDA), a fixed location data unit, and a computer; wherein the packaged integrated circuit is integrated into the device.

24. The system as set forth in claim 23, the first memory block having a first memory density, and the second memory block having a second memory density less than the first memory density.

25. A packaged integrated circuit comprising:
a first die comprising a random access memory, the random access memory comprising a first memory block having a first latency, and a second memory block having a second latency less than the first latency, wherein the first and second latencies are based on lengths of word lines within the first and second memory blocks respectively; and
a second die comprising an active side, the active side comprising a first part and a second part, and first means for electrically coupling the first part of the active side to the first memory block and second means for electrically coupling the second part of the active side to the second memory block.

26. The packaged integrated circuit as set forth in claim 25, the first memory block having a first memory density, and the second memory block having a second memory density less than the first memory density.

27. The packaged integrated circuit as set forth in claim 25, wherein the random access memory comprises dynamic random access memory.

28. A method comprising:
sending signals from a first part of an active side of a second die to a first block of a random access memory having a first latency and formed on a first die by way of a first set of through-die vias formed in the first part of the active side; and
sending signals from a second part of the active side of the second die to a second block of the random access memory having a second latency and formed on the first die by way of a second set of through-die vias formed in the second part of the active side;
wherein the first and second latencies are based on lengths of word lines within the first and second memory blocks respectively.

29. The method as set forth in claim 28, the first memory block having a first memory density, and the second memory block having a second memory density less than the first memory density.

30. A packaged integrated circuit comprising:
a first die comprising a random access memory, the random access memory comprising a first memory block having a first latency, and a second memory block having a second latency less than the first latency, wherein the first memory block comprises a higher number of hierarchical levels of memory and longer word lines than the second block memory block;

a second die comprising an active side, the active side comprising a first part and a second part, and a first set of through-die vias to electrically couple the first part of the active side to the first memory block and a second set of through-die vias to electrically couple the second part of the active side to the second memory block.

* * * * *